United States Patent
Kimura

[11] Patent Number: 6,122,705
[45] Date of Patent: Sep. 19, 2000

[54] SEMICONDUCTOR MEMORY DEVICE MULTIPLYING SYSTEM CLOCK FOR STORING DATA DIFFERENT IN DATA LENGTH

[75] Inventor: Tohru Kimura, Tokyo, Japan

[73] Assignee: NEC Corporation, Tokyo, Japan

[21] Appl. No.: 09/110,947

[22] Filed: Jul. 7, 1998

[30] Foreign Application Priority Data

Jul. 7, 1997 [JP] Japan .................................. 9-181229

[51] Int. Cl.[7] .................................................. G06F 13/16
[52] U.S. Cl. ......................... 711/104; 711/167; 711/171; 711/172
[58] Field of Search ................................... 711/167, 171, 711/172, 104; 710/127

[56] References Cited

U.S. PATENT DOCUMENTS

| | | | |
|---|---|---|---|
| 4,766,538 | 8/1988 | Miyoshi | 710/127 |
| 5,671,372 | 9/1997 | Price et al. | 710/127 |
| 5,761,478 | 6/1998 | Chen et al. | 711/172 |
| 5,781,918 | 7/1998 | Lieberman et al. | 711/5 |

FOREIGN PATENT DOCUMENTS

| | | |
|---|---|---|
| 63-188250 | 8/1988 | Japan . |
| 8-77065 | 3/1996 | Japan . |

*Primary Examiner*—Reginald G. Bragdon
*Attorney, Agent, or Firm*—Foley & Lardner

[57] ABSTRACT

A variable data-length memory device has memory blocks (27a–27d/26a–26d) storing n-bit data codes, an n-bit data output register (29b) connected between the memory blocks and an n-bit data bus (23a) and a frequency multiplier (29a) responsive to a control signal (CTL1) indicative of ($2^m \times n$) bit data code to be supplied to a logic unit (24) for changing a frequency of an internal clock signal (CLKin) $2^m$ times larger in frequency than a system clock (CLKex); although the memory blocks and the logic unit transfer the n-bit data codes and the ($2^m \times n$) bit data code in synchronism with the system clock, the data transfer between the output register and the memory blocks is controlled by the internal clock signal so as to convert the ($2^m \times n$) bit data code to the n-bit data code or data codes.

6 Claims, 6 Drawing Sheets

SEMICONDUCTOR MEMORY DEVICE MULTIPLYING SYSTEM CLOCK FOR STORING DATA DIFFERENT IN DATA LENGTH

FIELD OF THE INVENTION

This invention relates to a semiconductor memory device and, more particularly, to a semiconductor memory device for storing data different in length.

DESCRIPTION OF THE RELATED ART

Figure 1:
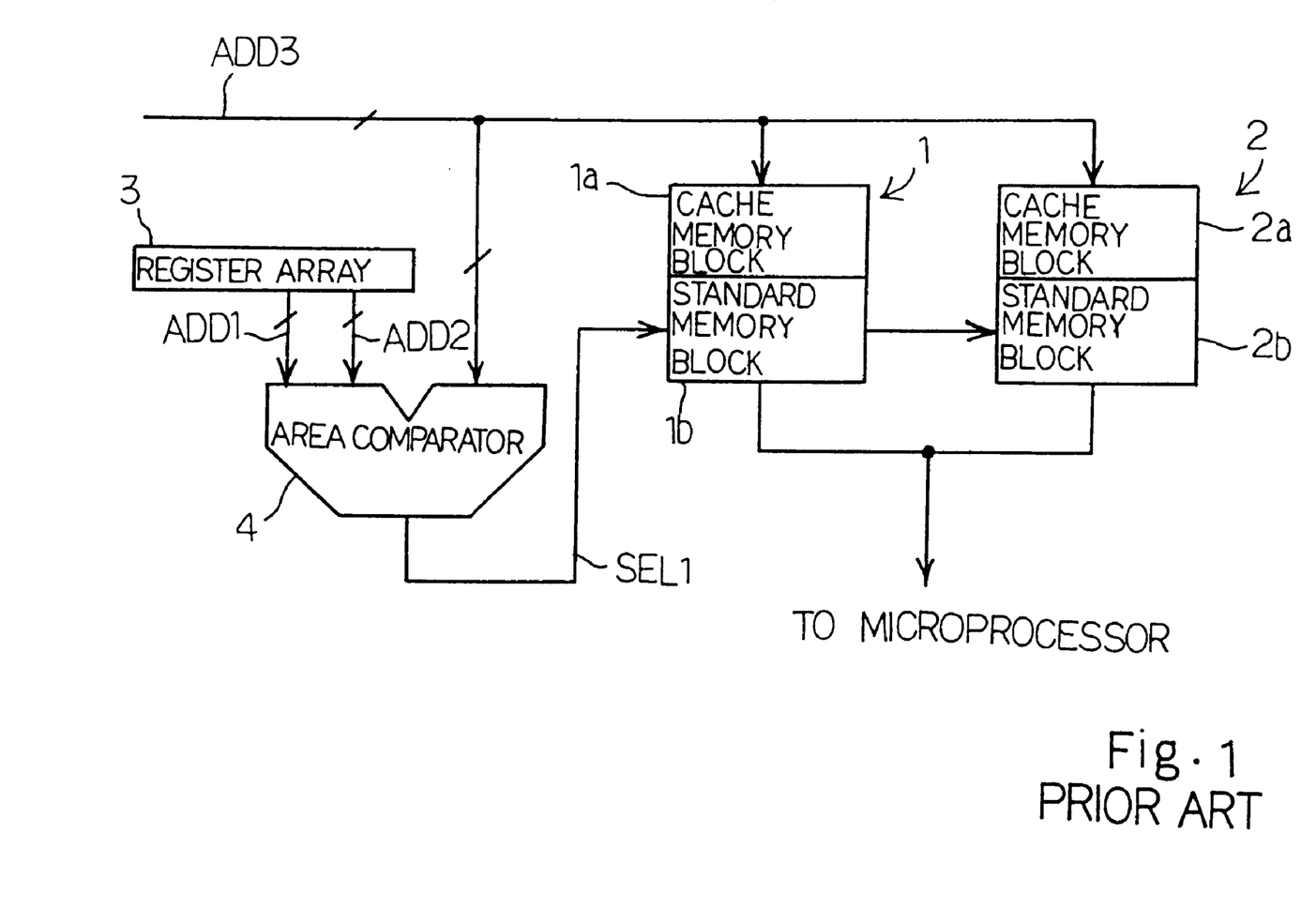
FIG. 1 is a block diagram showing the arrangement of the prior art variable-length memory system disclosed in Japanese Patent Publication of Unexamined Application No. 8-77065.

A logic unit such as a microprocessor is accompanied with a memory system. The logic unit stores data bits in and reads out the data bits from the memory system. A typical example of the memory system is illustrated in FIG. 1 of the drawings. The prior art memory system is disclosed in Japanese Patent Publication of Unexamined Application No. 8-77065. The prior art memory system has two memory units 1/2, and a cache memory block 1a/2a and a standard memory block 1b/2b form the memory unit 1/2. The memory system employs a direct mapping scheme, and fixed-length data codes are selectively stored in the standard memory blocks 1b/2b and the cache memory block 1a/2a.

A register array 3 and an area comparator 4 are provided to see whether an accessed data code is stored in the cache memory block 1a/2a or the standard memory block 1b/2b. The register array 3 stores the lowest address and the highest address assigned to the fixed-length data codes stored in the standard memory blocks 1b/2b. The register array 3 supplies address signals ADD1/ADD2 indicative of the lowest address and the highest address to the area comparator 4.

When a microprocessor fetches a fixed-length data stored in the memory system, the logic unit supplies an address signal ADD3 to the memory system. The address signal ADD3 has an address field indicative of the memory unit 1/2 to be accessed, and the address field makes one of the memory units 1/2 accessible. The cache memory block 1a/2a and the standard memory block 1b/2b of the selected memory unit 1/2 output fixed-length data codes, respectively.

The other address field is indicative of the address where the fixed-length data code is stored. The other address field is supplied to the area comparator 4, and the area comparator 4 compares the address of the other address field with the area between the lowest address and the highest address to see whether the fixed-length data code to be accessed is stored in the cache memory block 1a/1b or the standard memory block 1b/2b.

If the fixed-length data code to be accessed is stored in the standard memory block 1b/2b, the area comparator 4 changes a selecting signal SEL1 to an active level, and supplies it to the selected one of memory unit 1/2. As described hereinbefore, the two fixed-length data codes have been read out from the cache memory block 1a/2a and the standard memory block 1b/2b. The selecting signal SEL1 selects the fixed-length data code read out from the standard memory block 1b/2b, and the fixed-length data code to be accessed is read out from the selecting memory unit 1/2.

On the other hand, if the fixed-length data code to be accessed is stored in the cache memory block 1a/2a, the area comparator 4 changes the selecting signal SEL1 to inactive level, and supplies it to the standard memory blocks 1b/2b. In this situation, a hit signal is changed to active level. Then, the selected memory unit 1/2 selects the fixed-length data code read out from the cache memory block 1a or 2a, and supplies it to the microprocessor. The prior art memory unit 1/2 can not change the data length. For this reason, when the microprocessor (not shown) is changed to another microprocessor different in data length from it, the memory unit 1/2 are not available for the data storage, and needs to be redesigned.

Figure 2:
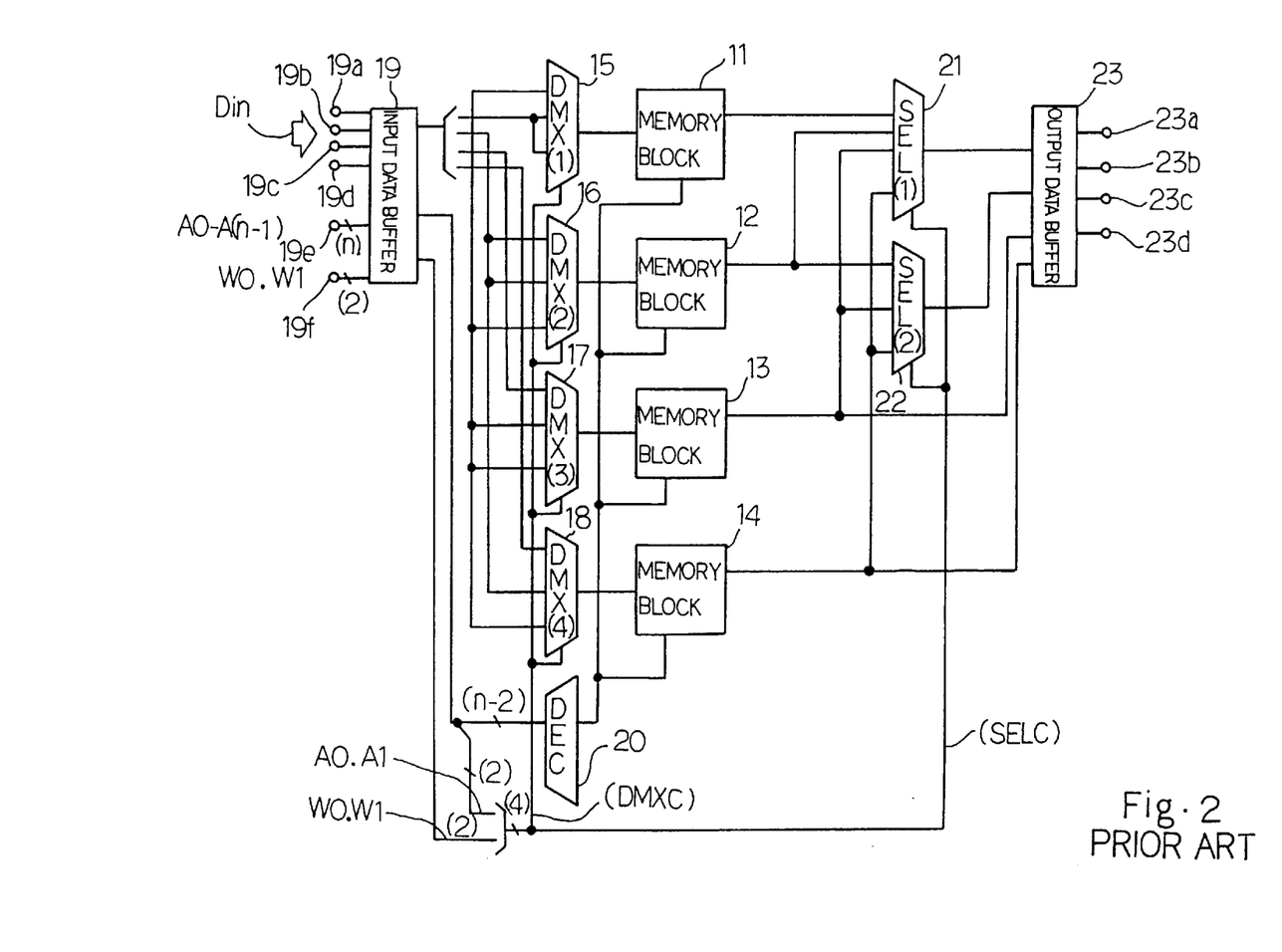
FIG. 2 is a block diagram showing the arrangement of the prior art variable-length memory system disclosed in Japanese Patent Publication of Unexamined Application No. 63-188250.

A variable data-length memory device is proposed in Japanese Patent Publication of Unexamined Application No. 63-188250, and FIG. 2 illustrates the prior art variable data-length memory device. The data length to be stored is changed between a single bit, two bits and four bits.

The prior art variable data-length memory device has four memory blocks 11/12/13/14, and each of the memory block has an input data port for a single data bit and an output data port for the single data bit. Four data selectors 15, 16, 17 and 18 are connected between an input data buffer 19 and the input data ports of the memory blocks 11 to 14, and the input data buffer 19 has four data pins 19a/19b/19c/19d, an address signal port 19e for an n-bit address signal A0 to A(n−1) and a control signal port 19f for a two-bit control signal W0/W1 indicative of the data-length to be stored in the memory blocks 11 to 14.

The address signal A-0 to A(n−1) is supplied to an address decoder 20. The address bits A0/A1 are indicative of a block address assigned to the memory blocks 11 to 14. When the prior art variable data-length memory device is expected to store a single bit data, the two-bit control signal W0/W1 indicates the data length of "1", and the memory blocks 11 to 14 are selectively used as the data storage for the single bit data. In this situation, the address bits A0/A1 and the control bits W0/W1 form a write-in control signal DMXC, and the write-in control signal DMXC causes the selectors 15 to 18 to selectively connect the input data buffer 19 to one of the memory blocks 11 to 14 indicated by the address bits A0/A1. The address decoder 20 enables the selected memory block 11 to 14, and the selected memory block 11/12/13/14 stores the single-bit data at the address indicated by the remaining address bits A2 to A(n−1).

If the memory blocks 11 to 14 are expected to store two-bit data, the control data signal W0/W1 indicates the data length of "2", and the memory blocks 11 to 14 are divided into two groups. The write-in control signal DMXC causes two selectors to connect the input data buffer 19 to one of the groups. The address decoder 20 enables two memory blocks of the selected group on the basis of the address bit A1, and ignores the address bit A0. The two-bit data is transferred to the memory blocks of the selected group, and is stored at the address indicated by the remaining address bits A2 to A(n−1).

If the memory blocks 11 to 14 are expected to store four-bit data, the control data signal W0/W1 indicates the data length of "4", and the write-in control signal DMXC causes the four selectors 15 to 18 to connect the input data buffer 19 to the four memory blocks 11 to 14. The address decoder 20 ignores the address bits A0/A1, and enables all the memory blocks 11 to 14. The four-bit data is transferred to the four memory blocks 11 to 14, and is stored at the address indicated by the remaining address bits A2 to A(n−1).

The prior art variable data-length memory device further comprises two selectors 21/22 connected between the memory blocks 11 to 14 and an output data buffer 23. The address bits A0/A1 and the control bits W0/W1 form a read-out control signal SELC, and selectors 21/22 connect a selected memory block, two memory blocks of the selected group or the four memory blocks to the output data buffer 23 depending upon the data length indicated by the control bits W0/W1.

Thus, the prior art variable data-length memory device is used as a data storage for three kinds of data different in data length. Nevertheless, the prior art variable data-length memory device is costly. The prior art variable data length memory device requires the selectors 15 to 18 for the write-in data and the selectors 21/22 for the read-out data, and the input data buffer 19 and the output data buffer 23 are designed to adopt the longest data. Moreover, the input data pins 19a to 19d and the output data bits 23a to 23d are assigned to the input data and the output data, and are equal to the number of bits of the longest data. When the variable data-length memory device is used for the single-bit data or the two-bit data, the input data buffer 19 and the output data buffer 23 partially stand idle, and two or three input/output data pins are useless. The manufacturer enlarges the semiconductor chip due to the selectors 15 to 18 and 21/22, the wide input data buffer 19 and the wide output data buffer 23, and requires a large package. As a result, the production cost is increased.

SUMMARY OF THE INVENTION

It is therefore an important object of the present invention to provide a variable data-length memory device, which is simple and low in production cost.

To accomplish the object, the present invention proposes to change a data transfer rate depending upon the length of data to be stored.

In accordance with one aspect of the present invention, there is provided a memory device comprising a plurality of memory blocks including respective addressable memory cell arrays and respective data buffers respectively connected to the addressable memory cell arrays and temporarily storing pieces of first data, a temporary data storage connected between the data buffers and an external device handling a piece of second data and a controlling means determining a ratio between component bits of the piece of second data and component bits of the piece of first data stored in each data buffer, selectively enabling the plurality of memory blocks for storing the piece of second data as one of the pieces of first data or more than one piece of first data and changing a data transfer rate between the temporary data storage and one of the data buffers or more than one data buffer depending upon the ratio.

The frequency of an internal clock signal may be changed for adjusting the data transfer rate.

BRIEF DESCRIPTION OF THE DRAWINGS

The features and advantages of the variable data-length memory device will be more clearly understood from the following description taken in conjunction with the accompanying drawings in which.

DESCRIPTION OF THE PREFERRED EMBODIMENT

Figures 3, 4:
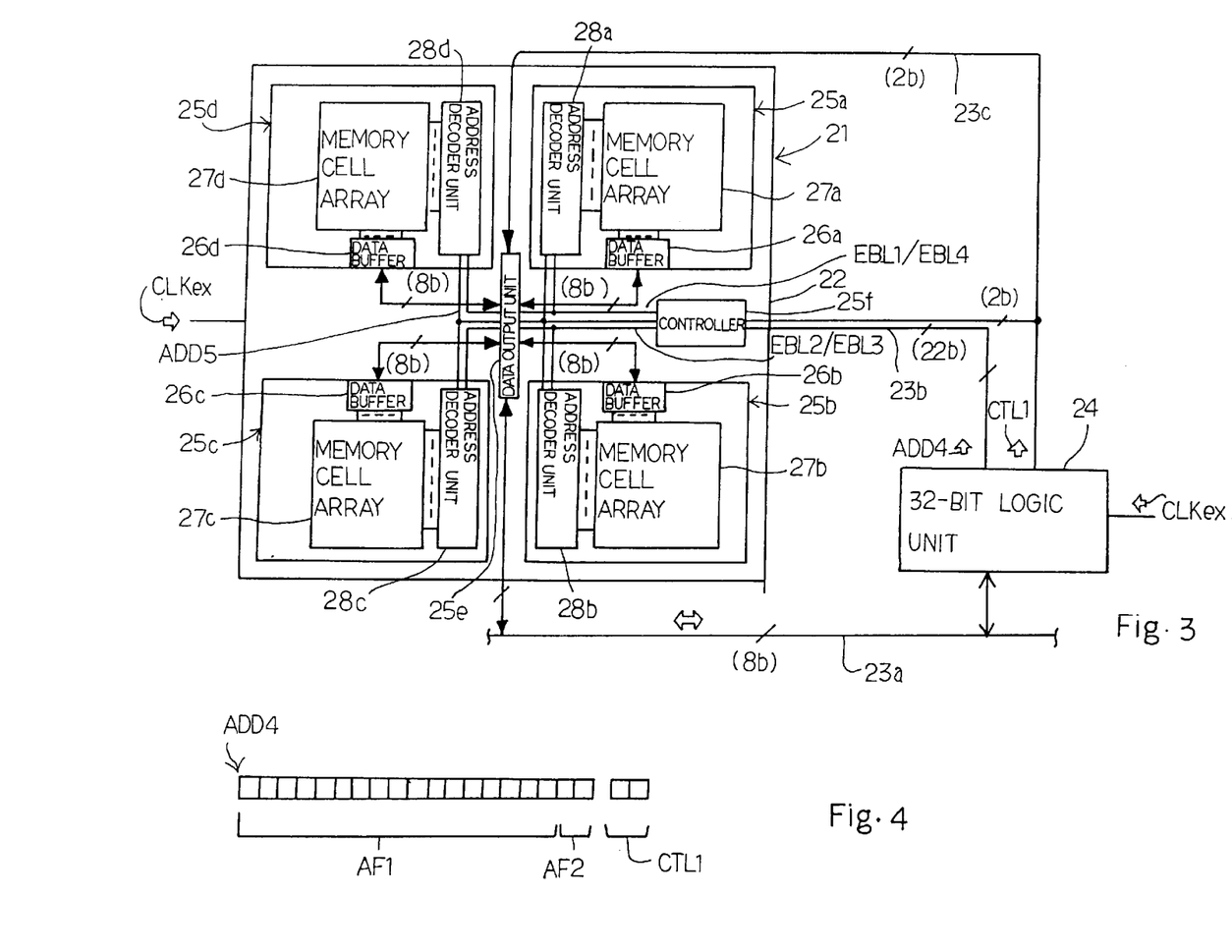
FIG. 3 is a view showing the arrangement of a semiconductor variable data-length memory device according to the present invention.
FIG. 4 is a view showing the format of an address signal used for the semiconductor variable data-length memory device.

Referring to FIG. 3 of the drawings, a semiconductor variable data-length memory device 21 embodying the present invention is fabricated on a semiconductor chip 22, and the semiconductor variable data-length memory device 21 is connected through a data bus 23a and an address bus 23b to a 32-bit logic gate 24 such as a 32-bit microprocessor. In this instance, the data bus 23a propagates 8 bits in parallel, and the address bus 23b propagates a 22 bit address signal ADD4. 32-bit data are written into and read out from the semiconductor variable data-length memory device 21. The 32-bit logic gate 24 is further connected to the semiconductor variable data-length memory device 21 through a 2-bit control bus 23c, and supplies a 2-bit control signal CTL1.

The semiconductor variable data-length memory device 21 comprises four memory blocks 25a, 25b, 25c and 25d, a data output unit 25e connected between the memory blocks 25a to 25d and the data bus 23a and a controller 25f connected to the address bus 23b. The control bus 23c is connected to the data output unit 25e. A system clock CLKex is further supplied to the semiconductor variable data-length memory device, and the frequency is 30 mega-Hz. The system clock CLKex is supplied to the memory blocks 25a to 25d, and 8-bit data are written into and read out from the memory blocks 25a to 25d in synchronism with the system clock CLKex.

The memory blocks 25a to 25d have respective data buffers 26a, 26b, 26c and 26d, respective memory cell arrays 27a, 27b, 27c and 27d and respective addressing units 28a, 28b, 28c and 28d. Each of the memory cell arrays 25a to 25d has memory cells for storing more than 1 mega bits. The address decoder unit 28a/28b/28c/28d selects eight memory cells from the memory cell array 27a/27b/27c/27d, and eight data bits are transferred between the selected memory cells and the data buffer 26a/26b/26c/26d.

The address bus 23b supplies the 22-bit address signal ADD4 to the controller 25f, and the address signal ADD4 is formatted shown in FIG. 4. The address signal ADD4 has a 20-bit address field AF1 and a 2-bit address field AF2. The 20-bit address field AF1 is indicative of an address assigned to the memory cells to be accessed, and the 2-bit address field AF2 is indicative of a memory cell block 25a/25b/25c/25d to be enabled. The 2-bit control data CTL1 is indicative of a data length. In this instance, the semiconductor variable data-length memory device 21 is expected to store 32-bit data. Each 32-bit data is divided into four 8-bit sub-data, which are concurrently stored in the four memory cell arrays 27a to 27d, respectively. In other words, the four memory blocks 25a to 25d are enabled for each access. For this reason, the controller 25f ignores the block address, and the address field AF2 is invalid. In detail, the controller 25f acquires a piece of control information that a write-in data signal and a read-out address signal have 32 bits from the control signal CTL1. Then, the controller 25f changes four enable signal lines EBL1/EBL2/EBL3/EBL4 to active level, and the four memory blocks 25a to 25d are enabled with the four enable signal lines EBL1 to EBL4. The controller 25f further produces an internal address signal from the address field AF1, and supplies the internal address signal through internal address signal lines ADD5 to the address decoder units 28a to 28d. The enable signal lines EBL1 to EBL4 have already made the address decoder units 28a to 28d responsive to the internal address signal. The address decoder units 28a to 28d select four groups of memory cells from the memory cell arrays 27a to 27d, respectively, and selected memory cells, i.e., eight memory cells of each group are connected to the associated data buffer 26a/26b/26c/26d.

Figure 5:
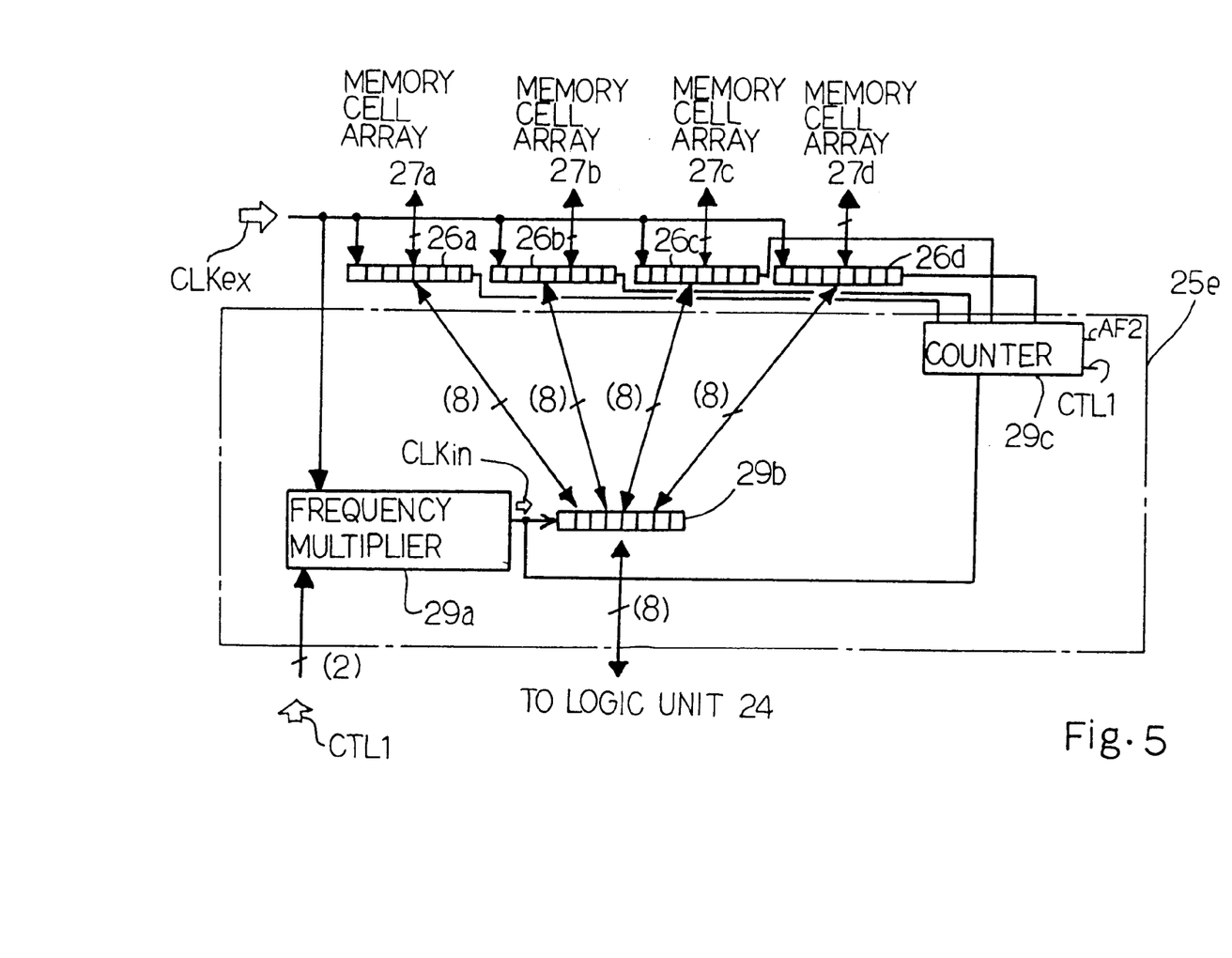
FIG. 5 is a block diagram showing the circuit configuration of a data output unit incorporated in the semiconductor variable data-length memory device.

The data output unit 25e is illustrated in detail in FIG. 5 of the drawings. The data output unit 25e includes a frequency multiplier 29a, an 8-bit parallel-in parallel-out register 29b connected between the data buffers 26a to 26d and the 8-bit data bus 23a and a counter 29c for controlling the data transfer between the parallel-in parallel-out register 29b and the data buffers 26a to 26d. The frequency multiplier 29a is responsive to the control signal CTL1 so as to determine the frequency ratio between the system clock signal CLKex and an internal clock signal CLKin. In this instance, 32 bit data is stored in the four 8-bit data buffers 26a to 26d, and the ratio is 4. Then, the frequency multiplier 29a four times increases the frequency, and supplies 120 mega-Hz internal clock signal CLKin to the parallel-in parallel-out register 29b and the counter 29c. The counter 29c counts the internal clock pulses CLKin, and sequentially enables the four data buffers 26a to 26d. For this reason, 32-bit data is transferred between the 32-bit logic unit 24 and the four data buffers 26a to 26d through the 8-bit data bus 23a and the 8-bit parallel-in parallel-out register 29b.

Figures 6, 7:
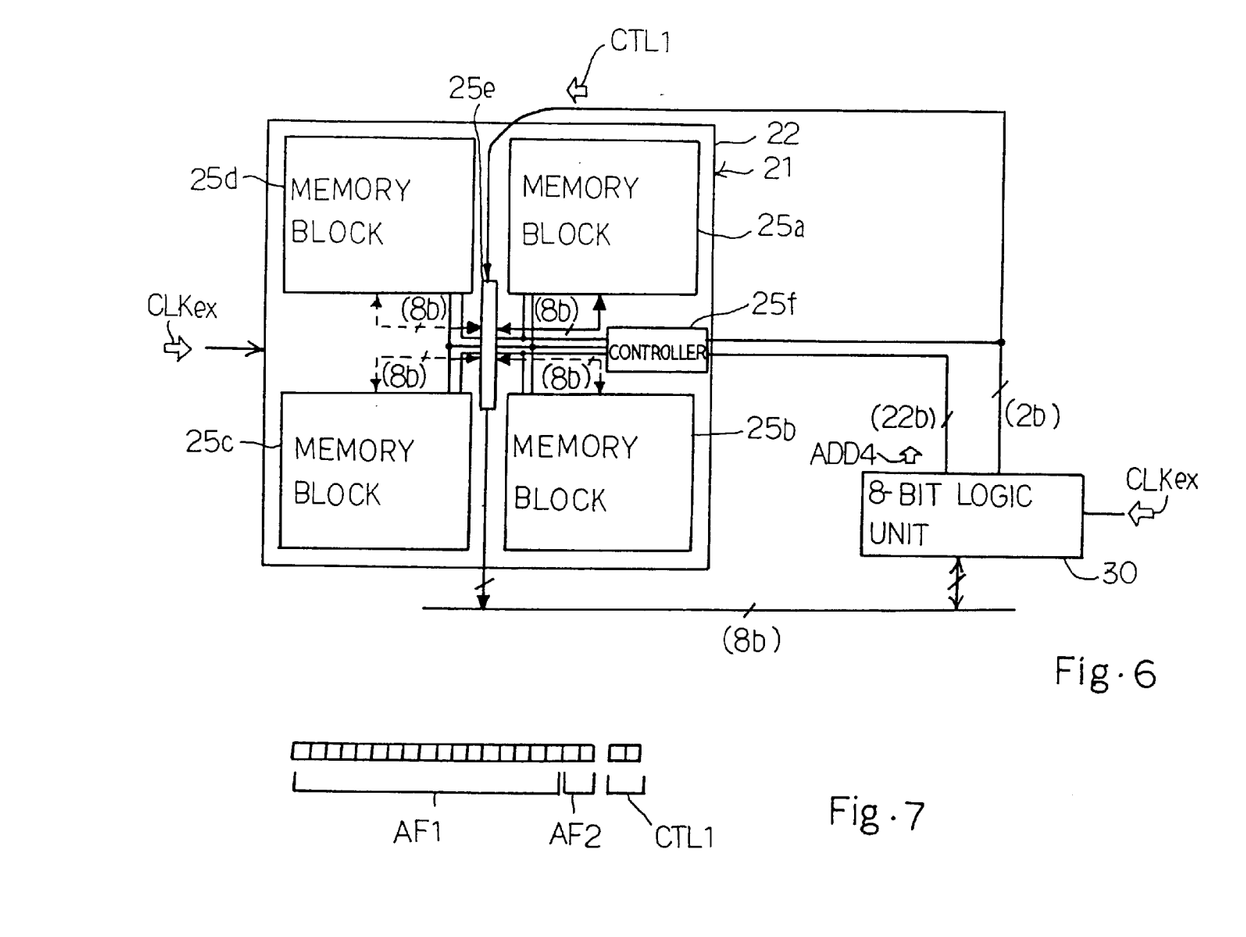
FIG. 6 is a block diagram showing the semiconductor variable data-length memory device associated with an 8-bit logic unit.
FIG. 7 is a view showing the address signal used in the semiconductor variable data-length memory device.

The semiconductor variable data-length memory device 21 is connected to an 8-bit logic unit 30 as shown in FIG. 6. The control signal CTL1 is indicative of 8 bits, and the 8-bit data are stored in one of the memory blocks 25a to 25d. Although the address signal ADD4 is formatted as similar to that used in the system shown in FIG. 3 (see FIG. 7), the control signal CTL1 makes the address field AF2 valid, and the controller 25f selectively enables the address decoder units 28a to 28d.

Moreover, the data output unit 25e acquires a piece of control information that 8-bit data are transferred between the logic unit 30 and the semiconductor variable data-length memory device from the control signal CTL1. Then, the data frequency multiplier 29a regulates the internal clock signal CLKin to 30 mega-Hz equal to the frequency of system clock CLKex.

Assuming now that the address field AF2 specifies the memory block 25a, the 8-bit logic unit 30 supplies the address signal ADD4 indicative of a memory location of the memory cell array 27a to the controller 25f, and the controller 25f only enables the address decoder unit 28a with the enable signal line EBL1. The address decoder unit 28a becomes responsive to the address represented by the address field AF1, and 8 memory cells are selected from the memory cell array 27a. The selected eight memory cells are connected to the data buffer 26a.

When 8-bit data is written into the selected memory cells, the 8-bit data is temporarily stored into the 8-bit parallel-in parallel-out register 29b, and in turn is transferred from the 8-bit parallel-in parallel-out register 29b to the data buffer 26d. The 8-bit data is finally written into the selected 8 memory cells. The data write-in operation is carried out in synchronism with the 30 mega-Hz system clock signal CLKex and the 30 mega-Hz internal clock signal CLKin.

On the other hand, when 8-bit data is read out from the selected memory cells, the 8-bit data is transferred from the data buffer 26d to the 8-bit parallel-in parallel-out register 29b in synchronism with the 30 mega-Hz internal clock signal CLKin, and is fetched by the 8-bit logic unit 30 in synchronism with the 30 mega-Hz system clock signal CLKex.

When the control signal CTL1 specifies 16-bit data, the controller 25f combines the memory blocks 25a/25b with the memory blocks 25c/25d, and enables one of the two memory groups depending upon the address field AF2.

In this instance, the 8-bit parallel-in parallel-out register 29b serves as a temporary data storage, and the controller 25f, the frequency multiplier 29a and the counter 29c as a whole constitute a controlling means.

As will be appreciated from the foregoing description, the frequency multiplier 29a changes the frequency of the internal clock signal CLKin depending upon the length of data to be handled, and the data bits are transferred at different speed. As a result, the interface is simple, and the production cost is reduced. The memory blocks 25a to 25d are concurrently fabricated on the semiconductor chip 22, and difference in write-in/read-out speed is negligible between the memory blocks 25a to 25d.

Although a particular embodiment of the present invention has been shown and described, it will be apparent to those skilled in the art that various changes and modifications may be made without departing from the spirit and scope of the present invention. The memory cell arrays 25a to 25d are implemented by any kind of memory cells such as, for example, a dynamic random access memory cell or a static random access memory cell.

Data may be read out from the memory blocks 25a to 25d, only, and the memory cell arrays 25a to 25d are implemented by read only memory cells or electrically programmable read only memory cells.

The number of memory blocks 25a to 25d is never limited to four.

Figure 8:
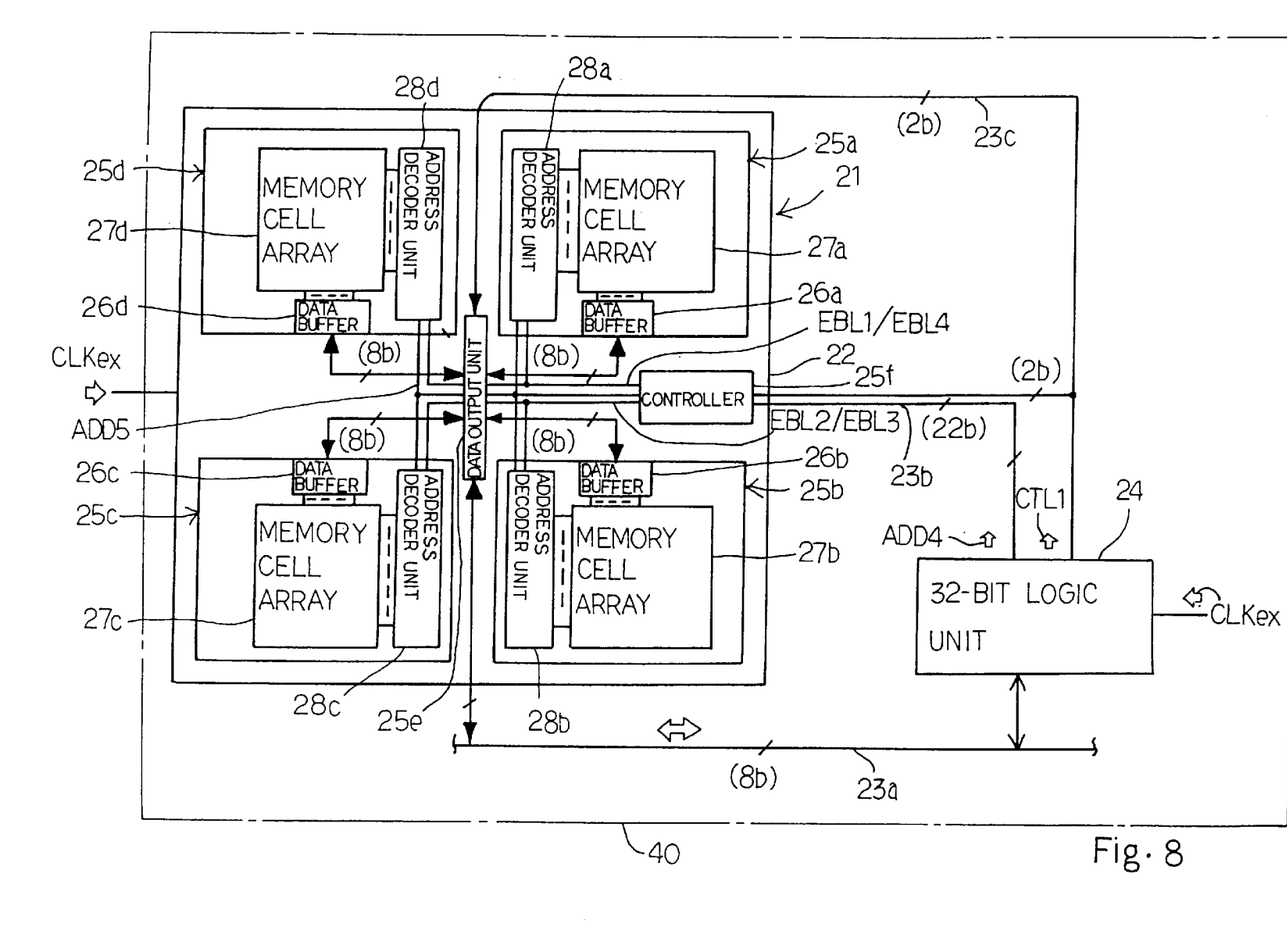
FIG. 8 is a block diagram showing the variable data-length memory device and the logic unit integrated on a semiconductor chip.

The semiconductor memory device 21 and the logic unit 24/30 may be integrated on a semiconductor chip 40 as shown in FIG. 8. Of course, another macro-block or blocks may be further integrated on the semiconductor chip 40. In this instance, the logic unit 24/30 and the memory device 21 are arrange in such a manner as to be close to each other, and the area occupied by the control bus 23c and the signal generator is negligible.

What is claimed is:

1. A memory device comprising
   a plurality of memory blocks (25a to 25d) including respective addressable memory cell arrays (27a to 27d) and respective data buffers (26a to 26d) respectively connected to said addressable memory cell arrays and temporarily storing pieces of first data, and
   a temporary data storage (29b) connected between said data buffers (26a to 26d) and an external device (24; 30) handling a piece of second data, characterized by further comprising
   a controlling means (29a/29c/25f) determining a ratio between component bits of said piece of second data and component bits of the piece of first data stored in each data buffer, selectively enabling said plurality of memory blocks for storing said piece of second data as one or more of said pieces of first data and changing a data transfer rate between said temporary data storage and one or more of said data buffers depending upon said ratio.

2. The memory device as set forth in claim 1, in which said external device (24; 30) and said plurality of memory blocks (25*a* to 25*d*) operate in synchronism with a system clock (CLKex) of a first frequency, said temporary data storage (29*b*) operates an internal clock signal (CLKin), and said controlling means regulates said internal clock signal to a second frequency equal to a product of a multiplication between said first frequency and said ratio.

3. The memory device as set forth in claim 1, in which said component bits of said piece of second data is expressed as $2^m$N where N is the number of said component bits of each piece of first data and $2^m$ is the number of said plurality of memory blocks (25*a* to 25*d*), and said external device (24; 30) informs said controlling means of the number of said component bits of said piece of second data by using an m-bit control signal (CTL1).

4. The memory device as set forth in claim 3, in which said controlling means includes a frequency multiplier (29*a*) responsive to said m-bit control signal for producing an internal clock signal (CLKin) having a frequency equal to a product of multiplication between a frequency of a system clock (CLKex) and said ratio, said plurality of memory blocks (25*a* to 25*d*) and said external device (24; 30) transfer said pieces of first data and said piece of second data in response to said system clock, and said controlling means controls said data transfer between said temporary data storage (29*b*) and each of said data buffers (26*a* to 26*d*) in synchronism with said internal clock signal (CLKin).

5. The memory device as set forth in claim 4, in which said plurality of memory blocks (25*a* to 25*d*), said temporary data storage (29*b*) and said controlling means (29*a*/29*c*/25*f*) are integrated on a semiconductor chip (22; 40).

6. The memory device as set forth in claim 4, in which said external device (24; 30) is further integrated on said semiconductor chip (40).

* * * * *